(12) United States Patent
Hartmann (10) Patent No.: US 8,399,900 B2
(45) Date of Patent: Mar. 19, 2013

(54) LIGHT EMITTING DEVICE AND METHOD FOR MANUFACTURING A LIGHT EMITTING DEVICE

(75) Inventor: Paul Hartmann, Weiz (AT)

(73) Assignee: Ledon Lighting Jennersdorf GmbH, Jennersdorf (AT)

( * ) Notice: Subject to any disclaimer, the term of this patent is extended or adjusted under 35 U.S.C. 154(b) by 174 days.

(21) Appl. No.: 12/989,779

(22) PCT Filed: Jan. 29, 2009

(86) PCT No.: PCT/EP2009/000572
§ 371 (c)(1),
(2), (4) Date: Dec. 30, 2010

(87) PCT Pub. No.: WO2009/132725
PCT Pub. Date: Nov. 5, 2009

(65) Prior Publication Data
US 2011/0089458 A1    Apr. 21, 2011

(30) Foreign Application Priority Data
Apr. 30, 2008   (DE) .......................... 10 2008 021 666

(51) Int. Cl.
*H01L 31/0232* (2006.01)
(52) U.S. Cl. ..................... 257/98; 257/E33.061; 438/29
(58) Field of Classification Search ................ 257/89, 257/98, E33.061; 438/28, 29
See application file for complete search history.

(56) References Cited

U.S. PATENT DOCUMENTS

| | | |
|---|---|---|
| 6,265,825 B1 | 7/2001 | Asano |
| 6,737,681 B2 * | 5/2004 | Koda ............................. 257/98 |
| 6,911,271 B1 | 6/2005 | Lamansky et al. |
| 7,088,040 B1 | 8/2006 | Ducharme |
| 7,309,881 B2 * | 12/2007 | Sato et al. ....................... 257/98 |
| 7,683,363 B2 | 3/2010 | Miteva et al. |
| 8,071,995 B2 * | 12/2011 | Sato et al. ....................... 257/98 |

(Continued)

FOREIGN PATENT DOCUMENTS

| | | |
|---|---|---|
| EP | 1 484 379 A1 | 12/2004 |
| EP | 0 939 425 B1 | 11/2005 |

(Continued)

OTHER PUBLICATIONS

Baluschev et al., "Upconversion with ultrabroad excitation band: Simultaneous use of two sensitizers," Applied Physics Letters 90, 181103, 2007.

(Continued)

*Primary Examiner* — Allan R Wilson
(74) *Attorney, Agent, or Firm* — Marshall, Gerstein & Borun LLP (57) ABSTRACT

A light emitting device and a method for manufacturing a light emitting device, wherein the light emitting device comprises a light emitting diode (LED) emitting light in a first emission spectrum, and a composition comprising at least two components and being adapted to absorb at least a part of the light in the first emission spectrum and upon absorption to emit an up-converted light in a second emission spectrum, wherein the light in said second emission spectrum has a wavelength range lower than the wavelength range of the light in the first emission spectrum, whereby the light emitted by the light emitting device comprises a mixture at least of light in the first emission spectrum and of light in the second emission spectrum.

32 Claims, 6 Drawing Sheets

U.S. PATENT DOCUMENTS

| | | | |
|---|---|---|---|
| 8,203,161 B2 * | 6/2012 | Simonian et al. | 257/98 |
| 8,207,659 B2 * | 6/2012 | Sato et al. | 313/483 |
| 2001/0001207 A1 * | 5/2001 | Shimizu et al. | 257/98 |
| 2003/0030067 A1 | 2/2003 | Chen | |
| 2004/0217692 A1 * | 11/2004 | Cho et al. | 313/503 |
| 2005/0133805 A1 * | 6/2005 | Yoshimatsu et al. | 257/98 |
| 2006/0001037 A1 * | 1/2006 | Schardt et al. | 257/98 |
| 2006/0081862 A1 * | 4/2006 | Chua et al. | 257/98 |
| 2006/0099449 A1 * | 5/2006 | Amano et al. | 428/690 |
| 2006/0231849 A1 * | 10/2006 | Kang et al. | 257/89 |
| 2007/0090381 A1 * | 4/2007 | Otsuka et al. | 257/98 |
| 2008/0103279 A1 | 5/2008 | Heun et al. | |
| 2009/0268461 A1 * | 10/2009 | Deak et al. | 362/247 |
| 2010/0193820 A1 * | 8/2010 | Kitamura | 257/98 |
| 2010/0276720 A1 * | 11/2010 | MacElwee et al. | 257/98 |
| 2011/0084293 A1 * | 4/2011 | Mueller-Mach et al. | 257/89 |
| 2012/0025253 A1 * | 2/2012 | Yamazaki et al. | 257/98 |

FOREIGN PATENT DOCUMENTS

| | | |
|---|---|---|
| WO | WO-02/15645 A1 | 2/2002 |
| WO | WO-2006/008068 A1 | 1/2006 |

OTHER PUBLICATIONS

International Search Report for PCT/EP2009/000572 dated May 29, 2009.

* cited by examiner

LIGHT EMITTING DEVICE AND METHOD FOR MANUFACTURING A LIGHT EMITTING DEVICE

BACKGROUND OF THE INVENTION

1. Field of the Invention

The present invention relates to a light emitting device and to a method for manufacturing a light emitting device. Specifically, the present invention relates to a light emitting device and a method for providing a light emitting device based on the principle of photon up-conversion.

2. Related Technology

In a number of systems, it has been observed that irradiation by light with longer wavelength causes emission of a light with shorter wavelength. This phenomenon, which is called "photon up-conversion" or "up-conversion" is mostly associated with high light intensities available from coherent light sources, such as lasers. The already existing examples of up-conversion, i.e. the generation of photons, notably spectrally blue-shifted to the wavelength of the excitation photons by simultaneous or sequential absorption of two or more photons with lower energy has always been associated with the use of coherent light sources and are not adapted to be used with non-coherent light sources. Another limitation of theses existing methods are the required high light intensities, with power densities commonly on the order of $MW/cm^2$ and $GW/cm^2$, which cannot be reached by means of incoherent light sources.

In the state of the art several approaches have been made in order to adopt the physical principle of up-conversion also for incoherent light sources. Document Baluschev, S. et al.: "Up-conversion with ultra broad excitation band: simultaneous use of two sensitizers" Applied Physics Letters 90, 181103 (2007) provides a composition providing a photon up-conversion based on triplet-triplet annihilation in a bi-molecular system. This document provides a possibility for up-converting the red part of the sun spectrum realised by ultra low excitation intensity and ultra broad excitation spectrum. Since a triplet-triplet annihilation supported by molecular up-conversion process is used this process is independent on the coherence of the excitation light. The optical excitation of the system occurs by resonant single photon absorption: consequently, the efficiency of the up-conversion process depends on the material properties but does not in any way depend on the coherence of the photons used for excitation.

In document EP 1 484 379 A1 a system for up-converting photon energy is provided. Here for a composition for photon energy up-conversion comprising at least two components is provided, wherein a first component is capable of absorbing energy at a first wavelength region and wherein a second component is capable of emitting energy at a second wavelength region, wherein the second wavelength region is smaller than the first wavelength region and wherein, upon absorption of energy by the first component the second component emits energy at said second wavelength region. Hereby as components two organic, respectively organometallic compounds are used. One of the two components acts as a sensitizer absorbing energy of a first, longer wavelength and storing this energy for a short time (typically microseconds) in a metastable triplet state. Compounds like metalloporphyrins are typically used for this purpose.

One disadvantage of the prior art is that the system was optimized for solar cell applications and has a limited applicability for light-emitting diodes due to the emission of only one single wavelength by the up-conversion composition (many applications of light-emitting diodes, especially in the promising fields of general lighting, require white LEDs with a broad emission spectrum over a wide range of emission wavelength). On the other hand, when providing additional compounds within the composition, in order to achieve emission of further wavelengths, this makes the structure of the composition complicated and the composition difficult to manufacture and complicated.

SUMMARY OF THE INVENTION

The invention provides a light emitting device and corresponding manufacturing method that overcomes the disadvantages of the state of the art. Specifically, the invention provides a light emitting device and corresponding manufacturing method which can be adapted to a variety of different applications and at the same time is easy to manufacture.

The present invention relates to a light emitting device comprising a light emitting diode (LED) emitting light in a first emission spectrum, and a composition comprising at least two components and being adapted to absorb at least a part of the light in the first emission spectrum and upon absorption to emit an up-converted light in a second emission spectrum, wherein the light in said second emission spectrum has a wavelength range lower than the wavelength range of the light in the first emission spectrum. Hereby the light emitted by the light emitting device comprises a mixture at least of light in the first emission spectrum and of light in the second emission spectrum.

The present invention further relates to a method for manufacturing a light emitting device comprising the steps of providing a light emitting diode emitting light in a first emission spectrum, providing a composition comprising at least two components and being adapted to absorb at least a part of the light in the first emission spectrum and upon absorption to emit an up-converted light in a second emission spectrum, wherein the light in said second emission spectrum has a wavelength range lower than the wavelength range of the light in the first emission spectrum and choosing the composition in such a way that the light emitted by the light emitting device comprises a mixture at least of light in the first emission spectrum and of light in the second emission spectrum.

BRIEF DESCRIPTION OF THE DRAWINGS

The present invention will now be explained in more detail in the following description of preferred embodiments in relation to the enclosed drawings in which FIG. 3b shows a detail of FIG. 3a, FIG. 4a shows a tri-band emission spectrum at ambient air, FIG. 4b shows a detail of FIG. 4a, FIG. 5a shows a tri-band emission spectrum at nitrogen, and FIG. 5b shows a detail of FIG. 5a.

Figure 1:
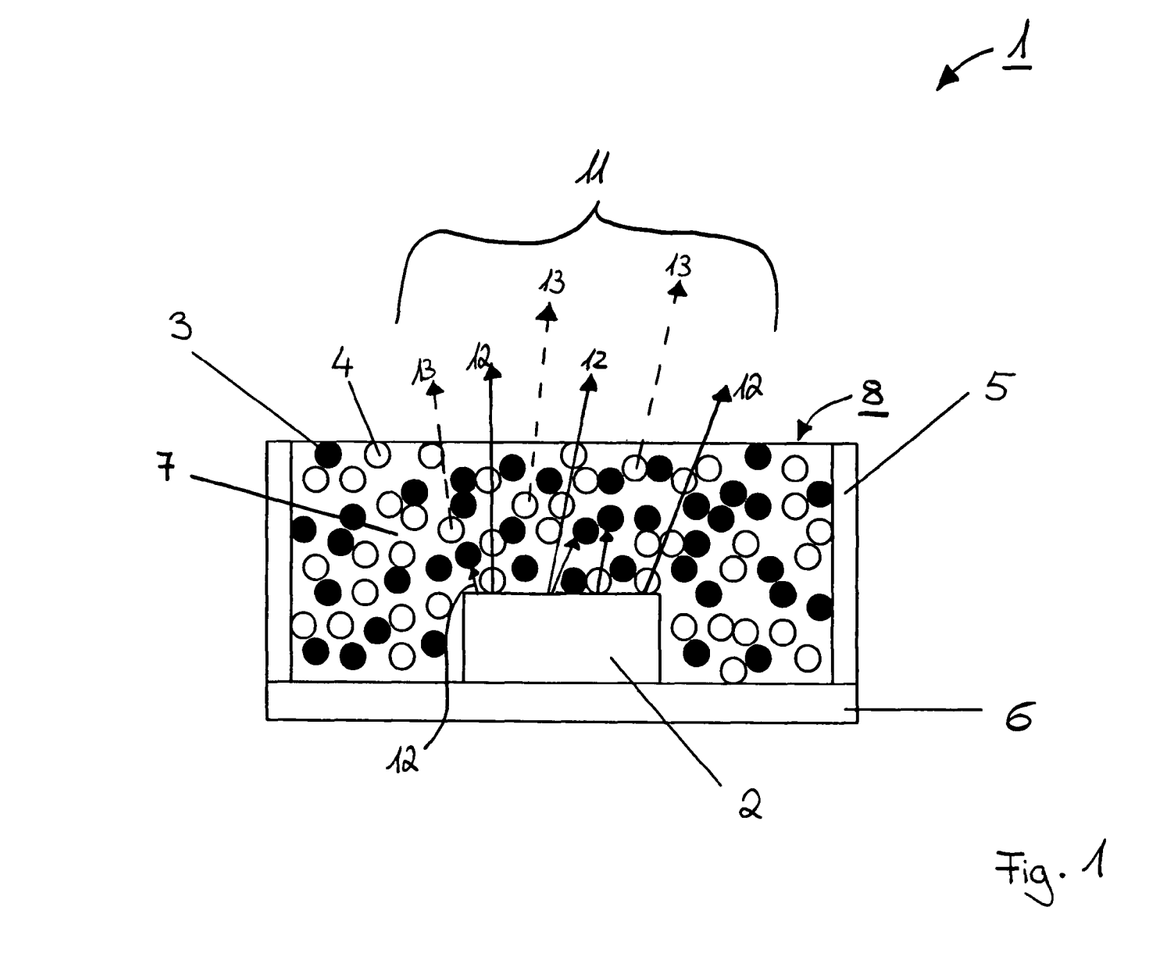
FIG. 1 shows a light emitting device according to the present invention.

FIG. 1 shows a light emitting device 1 according to the present invention. Referring to FIG. 1 the general idea of the present invention will be explained. Nevertheless, it is to be noted that FIG. 1 shows one embodiment of a light emitting device 1 according to the present invention and the present invention is not limited to the shown embodiment but can also comprise other embodiments as will be explained in detail in the following description.

The light emitting device 1 comprises a light emitting diode LED (LED chip) 2, which can be provided on a substrate 6. The light emitting diode 2 emits incoherent light in a first emission spectrum. Hereby, the light in the first emission spectrum is substantially monochromatic and has a very small wavelength range. The light in the first emission spectrum is exemplary shown by the use of arrows having reference numeral 12.

The light emitting device 1 further comprises a composition 8 comprising at least two components or substances (3, 4) embedded into a carrier material 7. Due to the at least two components 3, 4 the composition 8 is adapted to absorb at least a part of the light in the first emission spectrum 12 emitted by the LED 2 and upon absorption to emit an up-converted light in a second emission spectrum, wherein the light in the second emission spectrum has a wavelength range lower than the wavelength range of the light in the first emission spectrum 12. The light in the second emission spectrum is also exemplary shown by dashed arrows in the FIG. 1 having reference numeral 13.

The main idea of the present invention is to provide a composition 8 in such a way that the whole light 11 emitted by the light emitting device 1 comprises a mixture of at least light in the first emission spectrum 12 and light in the second emission spectrum 13. That means the light 11 emitted by the light emitting device 1 comprises the light emitted by the LED 2 and additionally the up-converted light in the second emission spectrum provided by the at least two components 3, 4 within the composition 8.

In order to allow the light in the first emission spectrum 12 emitted by the LED 2 to be part of the light 11 emitted by the light emitting device 1, the components 3, 4 within the composition 8 can be provided in such a way, that the composition when disposed onto the LED 2 provides transmissibility for at least a part of the light in this first emission spectrum 12 emitted by the LED 2. Otherwise, the composition can only be disposed onto a part of the LED 2, so that light in the first emission spectrum emitted by the LED 2 may exit the light emitting device 1 without passing the composition 8.

With this idea of mixing the light in the first emission spectrum 12 originating from the LED with at least one further light in a further emission spectrum, a variety of different types of light emitting devices 1 having different emission wavelengths or emission spectra can be provided. Another advantage of such a light emitting device 1 is the variability of the relative contribution of the distinct colors. By choosing the components, the concentration and the spectra, a number of different colors are achievable.

The up-conversion process hereby is accomplished by providing at least a first component 3 and a second component 4. The principle of this process is that the first component 3 is capable of absorbing light in the first emission spectrum 12 emitted by the LED and transferring at least a part of the excitation energy to the second component 4. Further, a plurality of members of the second component 4 is capable of receiving excitation energy from a plurality of members of the first component 3 and upon reception of the excitation energy emitting an up-converted light in the second emission spectrum 13. The detailed process of up-conversion will be explained later on.

With this two component embodiment as shown in FIG. 1 different light emitting devices having different emission wavelengths depending on the chosen LED 2 and on the chosen components 3, 4 within the composition 8 can be provided.

According to another embodiment the composition 8 may comprise a third component capable of absorbing light in the first emission spectrum and/or of absorbing light in the second emission spectrum and of emitting a down-converted light in a third emission spectrum. Hereby, this light in the third emission spectrum has a wavelength range higher than the wavelength range of the light in the first and second emission spectrum. That means that in the composition components can be provided, so that the light in the first emission spectrum 12 emitted by the LED can be mixed with an up converted and with a down converted light each having different emission spectra.

In a further embodiment alternatively to the third component or even additionally to the third component the first component 3 can be chosen in such a way that the emissive pathway of the first component 3 additionally to the light in the second emission spectrum 13 emitted by the second component 4 provides a light in a fourth emission spectrum having a wavelength range different from the wavelength range of the other lights. This can be achieved by carefully chosing choosing the materials and concentrations of the first and second components 3 and 4 in order to control the radiative rate of the metastable intermediate state of the first component 3 and its non-radiative rates in a way that the metastable state of the first component 3 has a significant rate of radiative relaxation to its ground state before being deactivated, for example, by energy transfer to the second component 4 or to molecular oxygen.

In any case the light 11 emitted by the light emitting device 1 comprises light in the first emission spectrum 12 emitted by the LED chip and additionally light in one or more different emission spectra.

The principle of the present invention can be applied to different light emitting devices. The application of the up-conversion principle to LEDs gives a unique opportunity to realize emission spectra of dual or triple or more colors from a single small semi-conductor light source. This may for example be a blue-green emission excited by a green LED 2 and photon up-conversion to blue phosphor emission.

A further application is a three-band emission using the combined principles of up-conversion and of down conversion. At the same time the resulting emission then consists of a mixture of the light in the first emission spectrum 12 of the primary LED chip that is not absorbed, an up-converted emission from the second component 4 and a residual down-converted emission from the first component 3. For example the emission may consist of a mixture of a green LED light that is not absorbed, a blue up-converted emission and a down-converted radiation from the sensitizer that may appear for example in the red spectral range. The system would represent a single RGB (Red-Green-Blue) LED spot. Alternatively, the system can be extended to contain additional known down-conversion phosphors absorbing either the primary green wavelength spectrum of the LED chip or the secondary blue wavelength spectrum of the up-converted light to produce additional light at longer wavelengths.

Another example is a red-yellow emission excited by a red LED and photon up-conversion to yellow phosphor emission. This is of particular interest since there are no bright yellow LED emitters available.

Generally, the amount, concentration and/or molecular composition of the different components within the composition 8 can be selected in such a way that the light 11 emitted by the light emitting device 1 has specific properties, e.g. appears as substantially white light.

It may happen that metalloporphyrins and some other molecules that provide a metastable, long-lived triplet state are subject to quenching by molecular oxygen that is always present under ambient air conditions due to its ability to penetrate the matrix material (liquids, polymers, silicones, etc.). The higher the lifetime of the metastable triplet state, the more efficient is the triplet-triplet annihilation process for up-conversion, but also the higher is the oxygen quenching efficiency.

Particularly organic molecules are less stable at high light intensities compared to inorganic molecules. LEDs, especially those intended to be used for lighting applications, require quite high light intensities to fulfill the demands of the application. Organic components as part of the LEDs might negatively affect the lifetime of such devices.

According to the present invention the components of the composition are advantageously chosen from inorganic materials or generally from materials overcoming the above-mentioned problems.

In particular, the molecular composition of the components within the composition 8 can be selected in such a way that the intermediate state is not accessible to quenching by oxygen. This can be achieved either by selecting components 3 and 4 to be insensitive to oxygen quenching, or alternatively, by selecting a matrix of the components 3 and 4 that has a low permeability to oxygen.

Favorably the molecular composition of the components offers a high photostability. Inorganic molecules like ruby show a particularly high photostability.

Referring again to FIG. 1 a housing 5 can be provided in the light emitting device 1 for housing the LED 2 and the composition 8. By this housing 5 further the direction of the light 11 emitted by the light emitting device 1 can be influenced by providing a housing 5 having low or no transmittability for oxygen.

Figure 2:
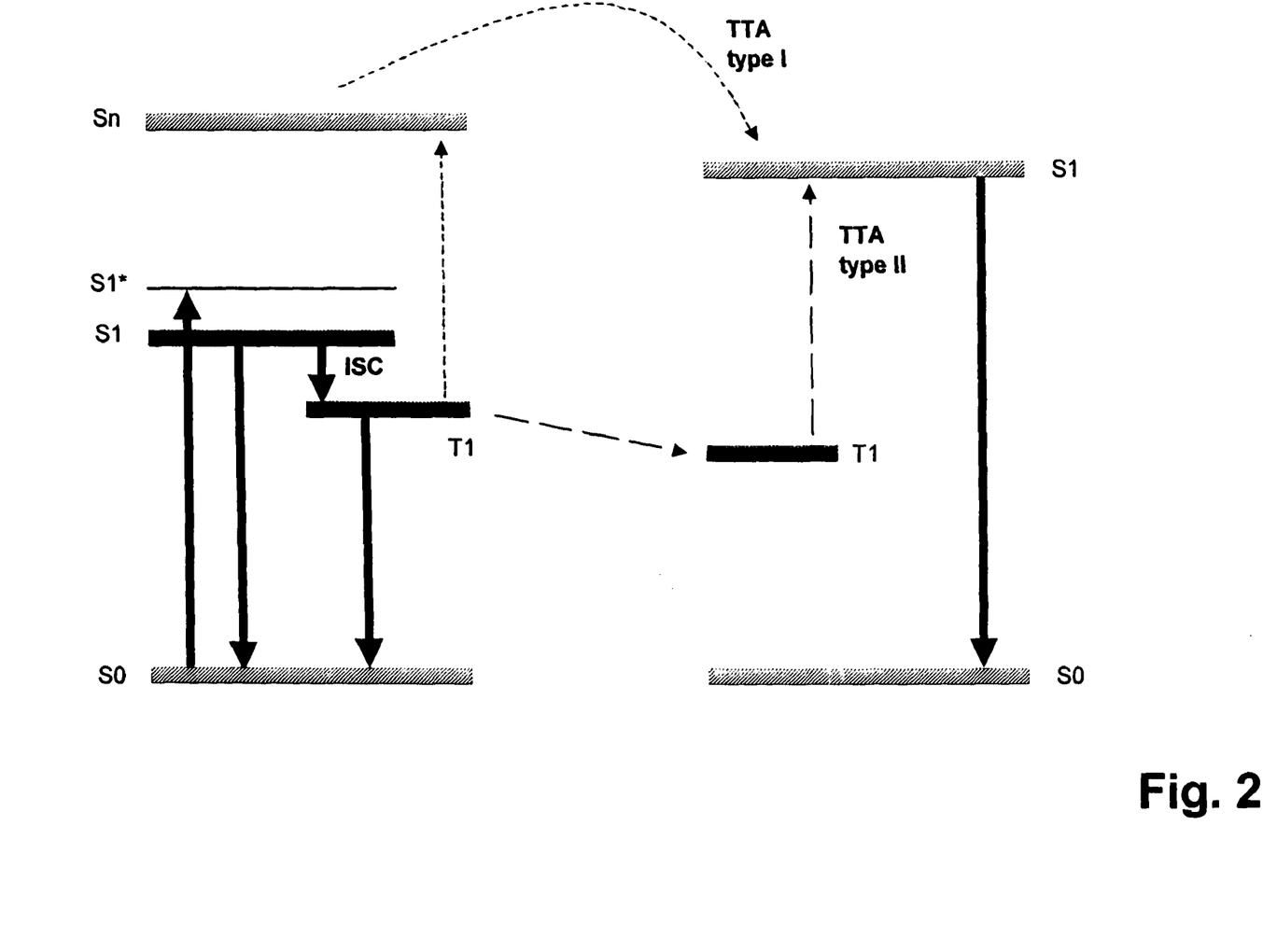
FIG. 2 shows the principle of an energy scheme of a TTA supported up-conversion process.

With reference to FIG. 2 now an example for the principle of photon up-conversion will be explained. Nevertheless, it is to be noted that the present invention is not limited to the specific energy scheme shown in FIG. 2 but can be applied to any types of components providing a photon up-conversion. For example, also energy levels and transitions of rare-earth doped glasses with higher quantum numbers like $4f$ and $5d$ states may provide particularly favorable systems for the photon up-conversion processes. FIG. 2 is only shown as an exemplary scheme for explaining the process underlying the up-conversion according to the present invention.

Molecular energy states in which all electrons belong to pairs with anti-parallel spin are named singlet states. In FIG. 2 these states are labeled by symbol S. For example, fluorescence is a singlet→singlet transition, or, more general, a transition between states of the same spin-quantum number.

On the other hand, the initial state of phosphorescence is a triplet excited state, which in the figures is labeled by T. In this case the spin of the lifted electron is oriented parallel to a second so-called unpaired electron in a ground state orbital. Phosphorescence occurs as return of the lifted electron in that ground state orbital connected with spin orientation reversal. Therefore, phosphorescence is a triplet→singlet transition or, more general, a transition between states of different spin-quantum numbers.

Transitions from the ground state to a triplet excitation state take place with small transition rate. Triplet states become populated on the roundabout route of singlet excitation with a subsequent spin reversal process, which is called intra system crossing ISC.

It may occur that two identical molecules, each in the triplet state, interact with each other in such a way, that both of them return to the ground state without emitting a photon. The said interaction process of the two molecules is called triplet-triplet annihilation (TTA).

Under certain well defined conditions it may occur that the energy of the triplet state of the first molecule is transferred to the triplet state of the second molecule, and before this metastable state can relax to the ground state, a third molecule being already activated in its triplet state transfers its energy sequentially to the second molecule, which jumps into a higher excited state (that may be, for example, a singlet state). From there, it may relax in usual way by internal conversion IC and then show fluorescence or any other light emission. This sequential two-photon absorption may also occur with involvement of even more molecules, thus representing a sequential multiphoton absorption process.

It may also occur that the first component 3 has a high probability for two- or even multiphoton absorption. In this case the metastable first state (e.g., a triplet) of the first component populated by absorption of a photon of the first wavelength is excited by absorption of another photon of the first wavelength to a higher excited state ($S_n$ in FIG. 2). Provided that this excited state is deactivated within its lifetime by efficient energy transfer to a suitable energy level of the second component 4 (energy transfer ET of type I in FIG. 2) this process may lead to a sensitized two-photon absorption and emission of the second component 4 as well.

The present invention is based on the principle of energy transfer as will be explained with reference to FIG. 2. Hereby, on the left side a sensitizer molecule is shown and on the right side an emitter molecule is shown. Hereby, the first molecule on the left side would correspond to the first component 3 and the second molecule on the right side would correspond to the second component 4. It is again to be noted that the molecules and corresponding energy schemes shown in FIG. 2 are only one exemplary embodiment.

Due to the absorption of photons of the first molecule an excitation into the singlet state $S_1$ occurs. Next, due to ISC a transition into the triplet state $T_1$ of the first molecule occurs. The life time of triplet state is quite long so that a plurality of excited states can be provided which then further on can be used for transferring excitation energy.

Periodically in the following two different processes are possible. An ET of the first type occurs between excited first molecules, whereby one molecule returns into the ground state and in the other molecule a higher singlet state $S_N$ is filled. From there an energy transfer to the singlet state $S_1$ of the second molecule is possible, provided that there is sufficient overlap of the wave functions of the two molecules. According to the second type of ET, the triplet state $T_1$ of the first molecule can directly cross over to the triplet state $T_1$ of the second molecule, while within the lifetime of this state $T_1$ another molecule of the first type, having an excited triplet state of its own, transfers its energy to the second molecule as well, so that a transition into the singlet state $S_1$ of the second molecule occurs.

Alternatively to the ET of the first type being initiated by combined energy transfer of two molecules of the first component 3, a two- or multiphoton absorption process of just one molecule of the first component 3 may as well lead to the population of the excited state $S_n$ that will undergo energy transfer of the first type to the excited state of the second component.

In any case, with the mechanism of the ET an excited singlet state $S_1$ within the second emitter molecule is provided which then can return into the ground state thereby emitting light in the second emission spectrum.

An example of photoluminescence up-conversion is a thin film of two more active components, e.g. metallated porphyrin macrocycles MOEP as sensitizers, blended in matrix of blue emitting molecules with high fluorescence quantum yield, such as polyfluorenes PF and polypentaphenylenes. The bimolecular up-conversion process in the system as explained relies on the presence of metastable triplet excited state and thus has different photophysical characteristics relative to the other known methods for photon up-conversion, such as two photon absorption, parametric processes, second harmonic generation, sequential multiphoton absorption and the like.

A problem of some of the known systems is that they are heavily quenched by oxygen. Specifically MOEPs, for example, and similar metal-organic sensitizers are commonly used as indicators in optical oxygen sensors. Therefore, advantageously in the system of the present invention molecules are used that do not show sensitivity to molecular oxygen. These are for example Eu and Tb-chelate complexes and most inorganic compounds that will be mentioned in the following in detail. Another possibility to limit oxygen quenching is the use of a matrix material for the emitting molecules, i.e. the use of a carrier material 7, that shows negligible or low permeability for oxygen. Examples are pure PVC (without plasticizers), PMMA, Nylon nylon, or inorganic glassy, ceramic or crystalline matrices.

Generally, the concentration and/or molecular compositions of the components 3, 4 and depending on the embodiment also of the other components within the composition 8 are selected in such a way that the light 11 emitted by the light emitting device 1 appears as mixed colors or appears as substantially white light.

In the following, different materials for the components are explained. It is to be noted that every material can be used for the first, second, third or any other component depending on the embodiment. Further, the below-mentioned possibilities and embodiments can be mixed with each other, where appropriate.

Generally, it is important to use suitable components since the systems described in the literature are subject to photo-degradation (also for green incident light, but to a smaller extent) and sometimes oxygen quenching. A suited phosphor in this respect shows bicolor absorption centers randomly mixed in close vicinity in a common host. This can be realized, e.g., by a crystal host or a glassy matrix, a ceramics, or a powder that carries both green and blue absorbing colour centers (doped ions). The color centers have to be homogeneously distributed and should show overlap of their respective wave functions. An example is ruby ($Al_2O_3$) co-doped with chromium (Cr) and thulium (Tm). Of advantage is a comparatively soft matrix.

It is understood in the meaning of the invention that many suitable phosphorescent systems like, for example, inorganic rare-earth doped glasses do not show excited states of singlet or triplet character (as has been used for the mechanistic example above), but rather typically provide d and f states of higher multiplicity. However, the principle effects described for the longlived triplet states can be translated to proper states of higher quantum numbers as well.

Another option is the use of YAB phosphors (as the host crystal) with dual doping agents (and thus dual absorption levels) since the matrix is softer than other glasses to allow efficient energy transfer between different states. A soft matrix provides a better effect than a glassy or crystalline matrix.

Another possibility are densely packed separate crystals (instead of doped ions) in a polymer or a silicone matrix. In this case, the distance between luminescence centers is bigger and sufficient overlap of wave functions is not very likely. Therefore a homogeneous distribution of the molecular components similar to a "solid solution" is more promising. This can be provided, e.g. by certain organic or organometallic materials, since these molecules are more suitable to form solid solutions in polymers.

Another option is the direct production of dual phosphors in a glass-ceramics state by using different components of the versatile family of the $(Ba,Ca,Sr)Si_2O_5:Eu^{2+}$ system.

In one embodiment, at least the two components are pluralities of individual molecules, dimers, aggregates or crystals.

At least the two components 3, 4 can be selected from the groups of porphyrins, phthalocyanines, organometallic complexes, fullerenes or carbon nanotubes or can be selected from the groups of inorganic nanoparticles, inorganic nanocrystals or inorganic powders.

Specifically, at least the two components 3, 4 can be selected from the groups of oxides, silicates, orthosilicates, oxy-orthosilicates, halosilicates, phosphates, halophosphates, borates, aluminates, gallates, molybdates, tungstates, halides, oxyhalides, sulfates, sulfides, oxysulfides, or carbo-nitrides.

At least one component 3, 4 is substantially insensitive to quenching by oxygen molecules.

In another embodiment, at least the two components 3, 4 form color centers co-doped into a common host crystal, glass, ceramics or powder. In a further embodiment, at least the two components 3, 4 are embedded randomly into a common host crystal, glass, ceramics or powder. The components can be ions co-doped into YAG or can be ions co-doped into YAB. The components co-doped into YAB can be selected from the group of Cr, Tm, Ce, and Eu.

Hereby, the host crystal, glass, ceramics or powder is selected from the groups of oxides, silicates, orthosilicates, oxy-orthosilicates, halosilicates, phosphates, halophosphates, borates, aluminates, gallates, molybdates, tungstates, halides, oxyhalides, sulfates, sulfides, oxysulfides, or carbo-nitrides.

Further, the dopant molecules and/or the components can be selected from ions of Ce, Cr, Tm, Tb, Eu, Dy, Sm, Pr, Bi, Cu, Na, Mn, Pb, Se, Er, Cd or Al.

In one specific embodiment, the components are ions co-doped into ruby $Al_2O_3$. Hereby, the first component 3 can be an ion of Cr and the second component 4 can be selected from ions of Ce, Tm, Tb, Eu, Dy, Sm, Pr, Bi, Cu, Na, Mn, Pb, Se, Er, Cd or Al.

At least the two components 3, 4 can be embedded into a polymer matrix, whereby the polymer matrix is a polystyrene, a PVC, a PMMA, a PEMA, a silicone, a polysulfone, a polyurethane, a poly-nitride, a poly-alcohol, ethylcellulose, poly-butyl-styrene, poly-vinyl-butyral, poly-methyl-styrene, poly-butadiene, a hydrogel, or a combination thereof. In a preferred embodiment, the polymer matrix has a permeability for oxygen lower than $3*10^{-10}$ $cm^2/(s \cdot cm_{Hg})$ or in a preferred embodiment lower than $1*10^{-10}$ $cm^2/(s \cdot cm_{Hg})$.

Alternatively, the components are embedded into a oligomer matrix. In a further alternative embodiment, the components are dispersed into a solution.

Figure 3A:
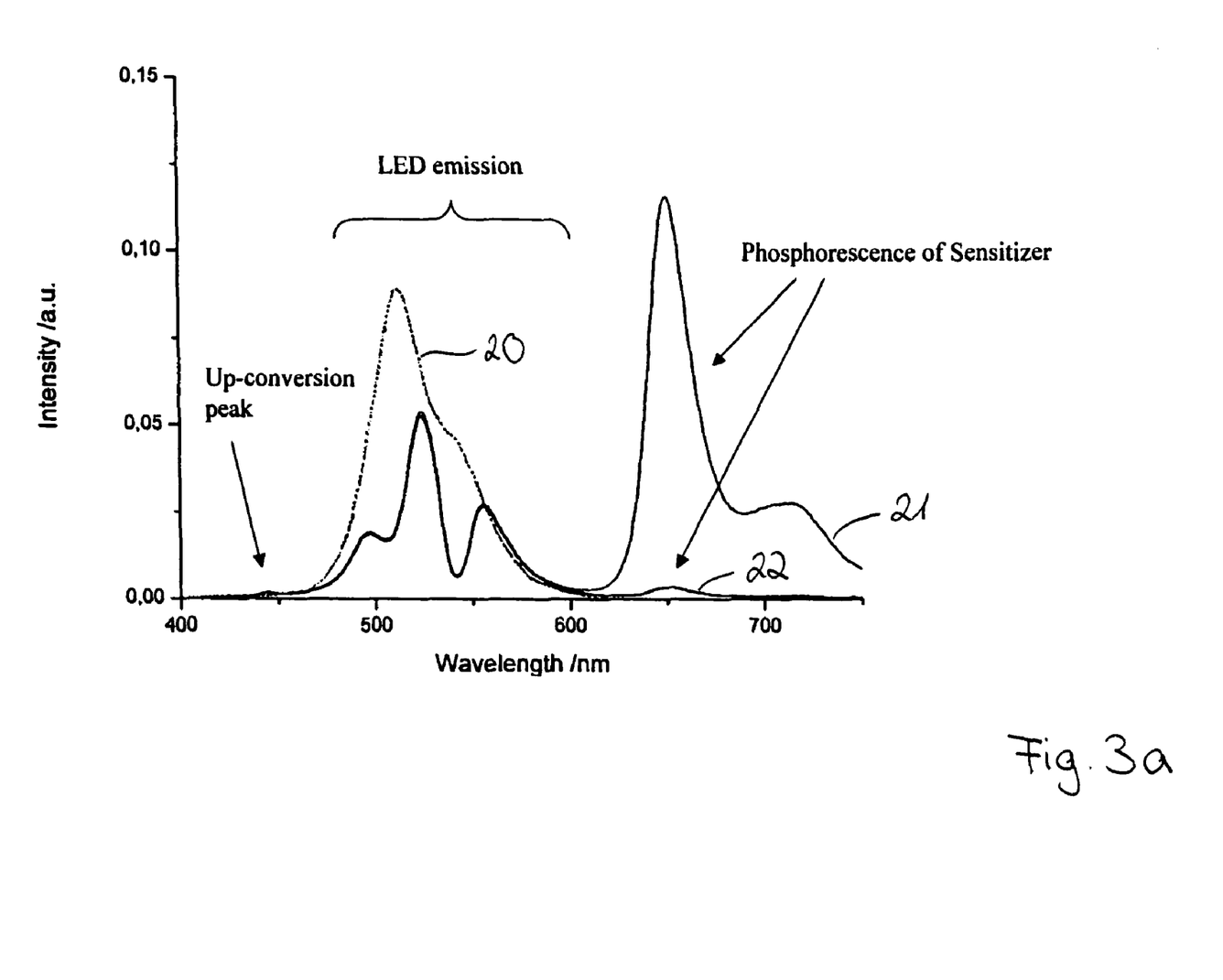
FIG. 3a shows a tri-band emission spectrum.

FIG. 3a shows a tri-band emission spectrum achieved with a light emitting device 1 according to one embodiment of the present invention. This light emitting device 1 delivers three different colors in a wide spectral range. For this purpose, as composition 8 an up-conversion mixture consisting of a Pt-octaethylporphyrin in a polyfluorene matrix is placed in front of a green inorganic LED 2 (e.g., an InGaN LED).

Parts of the green excitation light will pass through the composition 8 without being absorbed while the remaining fraction fills the excited triplet states of the porphyrin by efficient ISC. The sensitizer triplet either emits red phosphorescence or undergoes TTT to the meta-stable triplet of an adjacent polyfluorene.

Finally, TTA takes place followed by blue emission. The result is a tri-band emissive device (green from the LED 2, red from parts of the sensitizer molecules, i.e. the first component 3, and up-converted blue from the emitter, i.e. the second component 4) producing white light.

An example for such an emission spectrum is shown in FIG. 3a. In this embodiment, an upconversion mixture of Pt-OEP and Polyfluorene (in toluene, respectively, in PDMS) was exposed to radiation of a standard green High-power LED (P211-2G of TridonicAtco).

The original emission spectrum 20 of the LED 2 is shown as dotted line in FIG. 3. In the emission spectrum of the light emitting device 1a peak in the range of the LED emission appears, a further peak from the phosphorescence of the sensitizer and a further peak related to the up-converted part of the emission spectrum.

In FIG. 3a an emission spectrum at nitrogen is indicated with reference numeral 21 and an emission spectrum a ambient air is indicated with reference numeral 22.

Figure 3B:
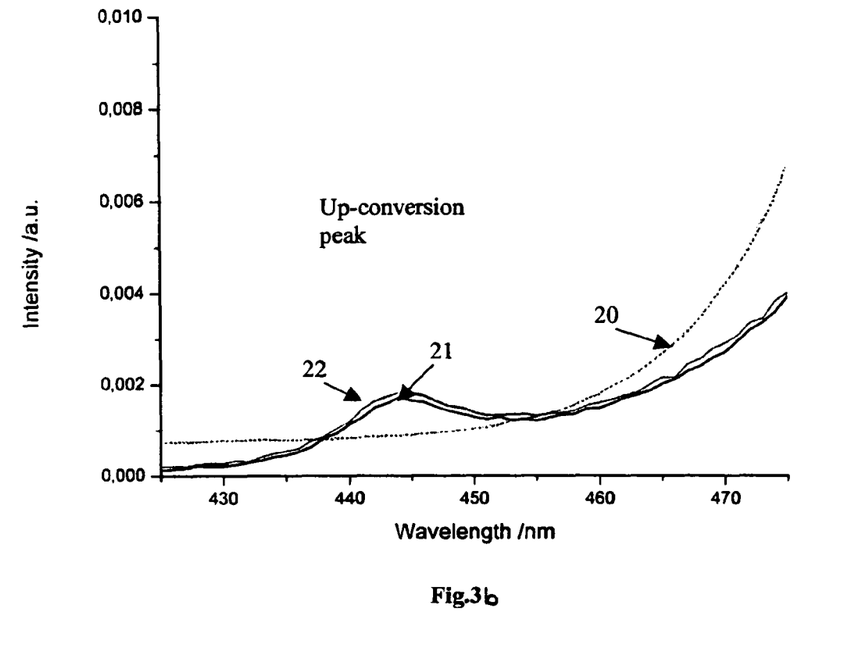

In FIG. 3b a detail view of a part of FIG. 3a is shown, specifically the part of the spectrum in the region of the up conversion peak is shown. Like in FIG. 3a, the emission spectrum at nitrogen is indicated with reference numeral 21 and the emission spectrum a ambient air is indicated with reference numeral 22.

As can be seen, the use of ambient air or nitrogen does mainly influence the phosphorescence peak and hardly influences the up conversion peak.

The reasons for this will be explained in the following. In polymer matrices and even more so in liquid solution any presence of molecular oxygen has to be avoided since it efficiently depopulates the excited triplet state of the sensitizer. This effect is clearly visible in the graph 21 of FIGS. 3a and 3b where the UC solution in toluene is equilibrated with ambient air and bubbled with nitrogen, respectively. It can be seen that the red emission of the porphyrin is, as expected, heavily quenched by oxygen, while the blue up-conversion peak is not affected. This suggests that the triplet of the emitter is not susceptible to oxygen quenching, while only those excited sensitizer states are quenched that are not overlapping with an emitter triplet.

Therefore, the selection of an appropriate carrier material 7 influences the emission spectrum. One possibility is to disperse the phosphors in matrices like silicone (PDMS), so that the oxygen quenching effect is smaller. A possible route to avoid it almost completely is to use polymer matrices with low oxygen permeability, e.g., PVC.

Figure 4A:
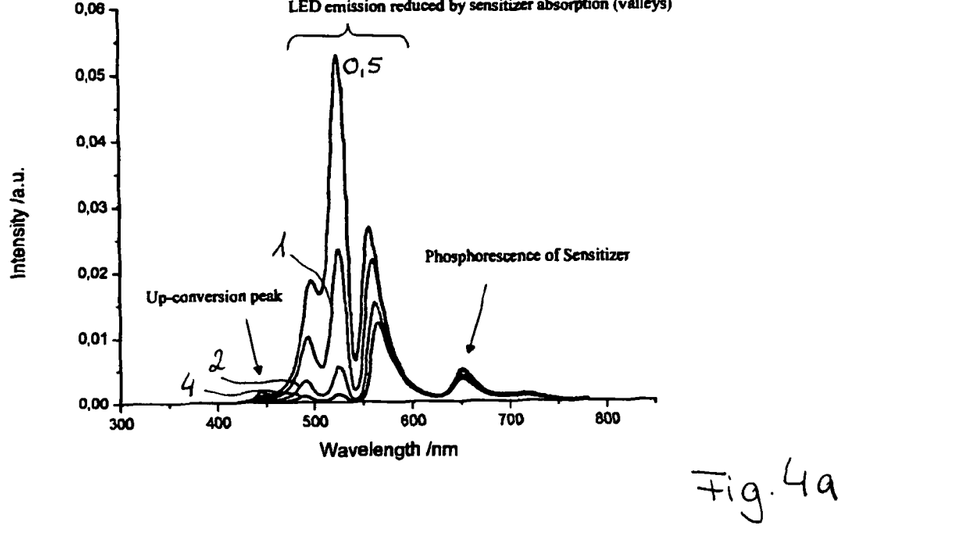
Figure 5A:
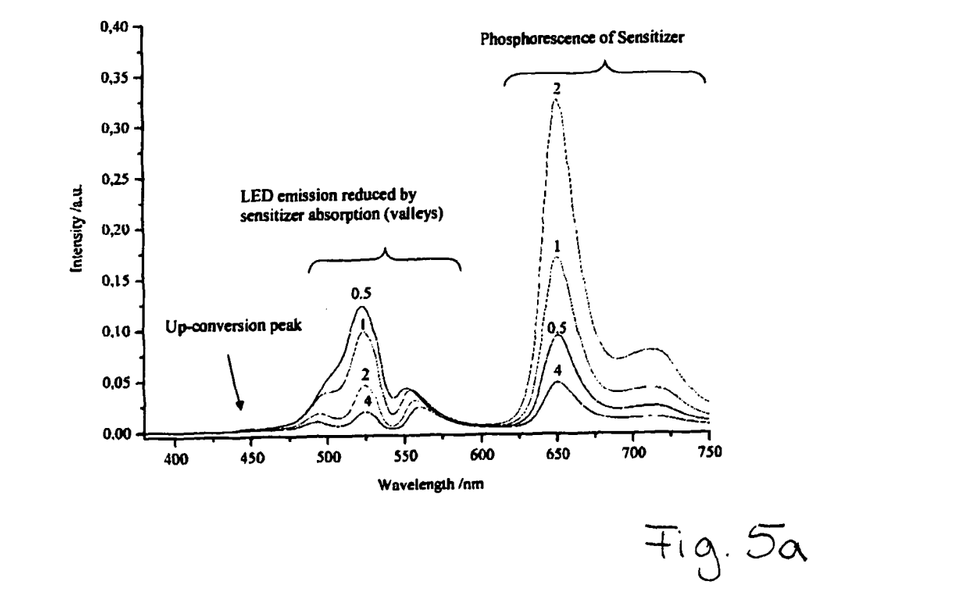

FIGS. 4a and 5a show tri-band emission spectra achieved with the same light emitting device 1, which was used for the emission spectrum of FIG. 3a. Both figures show emission spectra with different concentrations of the sensitizer, i.e. the first component 3 within the composition 8.

FIG. 4a hereby shows measurements at ambient air-saturated toluene solution for different concentrations of the sensitizer. A initial concentration is indicated with 1, half the initial concentration is indicated with 0.5, the double initial concentration is indicated with 2 and the quadruple initial concentration is indicated with 4.

Figure 4B:
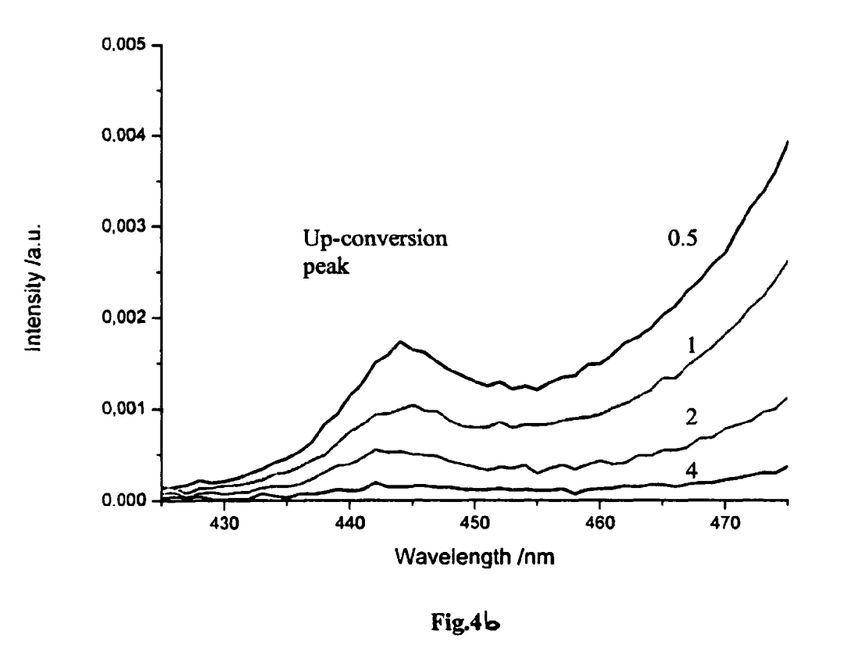

FIG. 4b shows a detail of FIG. 4a, specifically the up conversion peak in an enlarged view.

Likewise, FIG. 5a, shows measurements at nitrogen-saturated toluene solution for different concentrations of the sensitizer. A initial concentration is indicated with 1, half the initial concentration is indicated with 0.5, the double initial concentration is indicated with 2 and the quadruple initial concentration is indicated with 4.

Figure 5B:
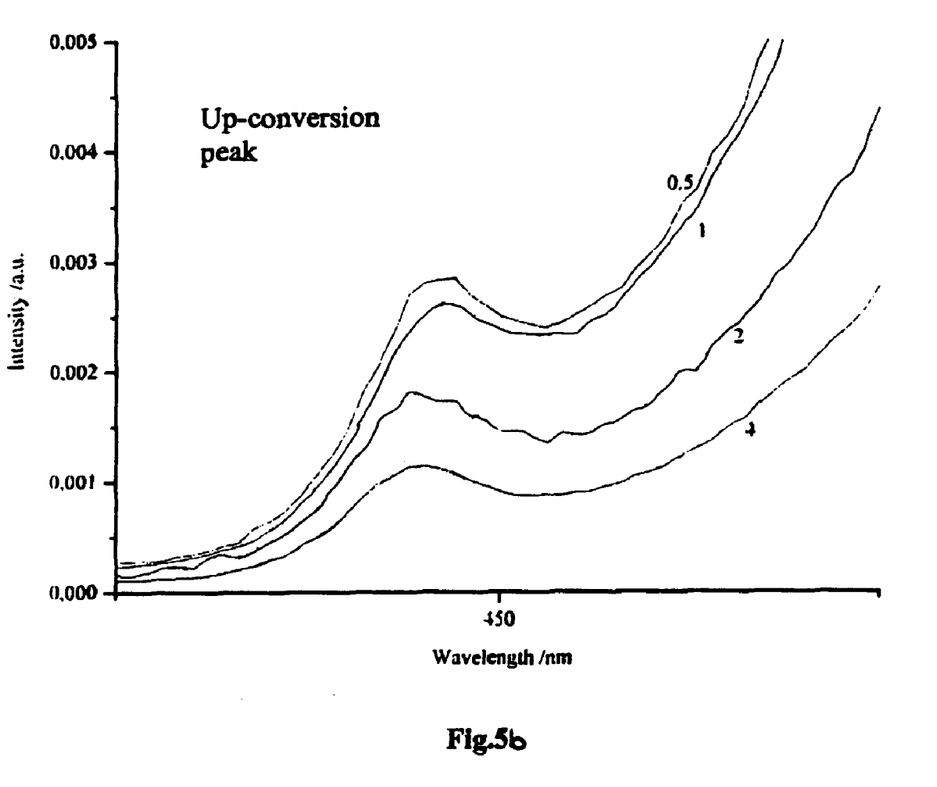

FIG. 5b shows a detail of FIG. 5a, specifically the up conversion peak in an enlarged view.

From the above embodiments and measurements it is clear, that the emission spectrum generally can be influenced by different parameters, such as the types of components 3, 4 within the composition, the concentration of the components 3, 4, the type of the carrier material 7, the type of LED 2 or any other parameter described within the present application.

The invention claimed is:

1. A light emitting device comprising
   a light emitting diode emitting light in a first emission spectrum, and
   a composition comprising at least two components and being adapted to absorb at least a part of the light in the first emission spectrum and upon absorption to emit up-converted light in a second emission spectrum, wherein the light in said second emission spectrum has a wavelength range shorter than the wavelength range of the light in the first emission spectrum, and
   wherein the light emitted by the light emitting device comprises a mixture at least of light in the first emission spectrum and of light in the second emission spectrum, wherein:
   the composition comprises at least a first component and a second component,
   the first component is capable of absorbing light in the first emission spectrum and transferring at least a part of the excitation energy to the second component,
   the second component is capable of receiving excitation energy from a plurality of members of the first component and upon reception of the excitation energy emitting an up-converted light in the second emission spectrum, and
   the emissive pathway of the first component additionally provides a light in a fourth emission spectrum having a wavelength range different from the wavelength range of the light in the first and second emission spectra.

2. Light emitting device according to claim 1, wherein the composition comprises a third component capable of absorbing light in the first emission spectrum and/or light in the second emission spectrum and of emitting a down-converted light in a third emission spectrum having a wavelength range higher than the wavelength range of the light in the first and second emission spectra.

3. Light emitting device according to claim 1, wherein the light emitted by the light emitting device comprises a mixture of light in the first emission spectrum, of light in the second emission spectrum and additionally of light in the third emission spectrum and/or fourth emission spectrum.

4. Light emitting device according to claim 1, wherein the amount, concentration, and/or molecular compositions of the components within the composition are selected in such a way that the light emitted by the light emitting device appears as mixed colors or appears as substantially white light.

5. Light emitting device according to claim 1, wherein at least one component is a plurality of individual molecules, dimers, aggregates, or crystals.

6. Light emitting device according to claim 1, wherein at least one component is selected from the group consisting of porphyrins, phthalocyanines, organometallic complexes, polyfluorenes, oligofluorenes, stilbenes, fullerenes, and carbon nanotubes.

7. Light emitting device according to claim 1, wherein at least one component is selected from the group consisting of inorganic nanoparticles, inorganic nanocrystals, and inorganic powders.

8. Light emitting device according to claim 7, wherein at least one component is selected from the group consisting of oxides, silicates, orthosilicates, oxy-orthosilicates, halosilicates, phosphates, halophosphates, borates, aluminates, gallates, molybdates, tungstates, halides, oxyhalides, sulfates, sulfides, oxysulfides, and carbo-nitrides.

9. Light emitting device according to claim 1, wherein the at least one component is substantially insensitive to quenching by oxygen molecules.

10. Light emitting device according to claim 1, wherein at least one component forms color centers co-doped into a common host crystal, glass, ceramics, or powder.

11. Light emitting device according to claim 1, wherein at least one component is embedded randomly into a common host crystal, glass, ceramics, or powder.

12. Light emitting device according to claim 10, wherein the host crystal, glass, ceramics, or powder is selected from the group consisting of oxides, silicates, orthosilicates, oxy-orthosilicates, halosilicates, phosphates, halophosphates, borates, aluminates, gallates, molybdates, tungstates, halides, oxyhalides, sulfates, sulfides, oxysulfides, and carbo-nitrides.

13. Light emitting device according to claim 1, wherein the dopant molecules and/or the components are selected from ions of the group consisting of Ce, Cr, Tm, Tb, Eu, Dy, Sm, Pr, Bi, Cu, Na, Mn, Pb, Se, Er, Cd, and Al.

14. Light emitting device according to claim 10, wherein the components are ions co-doped into ruby $Al_2O_3$.

15. Light emitting device according to claim 13, wherein the first component is an ion of Cr.

16. Light emitting device according to claim 15, wherein the second component is selected from the group consisting of ions of Ce, Tm, Tb, Eu, Dy, Sm, Pr, Bi, Cu, Na, Mn, Pb, Se, Er, Cd, and Al.

17. Light emitting device according to claim 10, wherein the components are ions co-doped into YAG.

18. Light emitting device according to claim 10, wherein the components are ions co-doped into YAB.

19. Light emitting device according to claim 15, wherein the components co-doped into YAB are selected from the group consisting of Cr, Tm, Ce, and Eu.

20. Light emitting device according to claim 1, wherein at least the components are embedded into a polymer matrix.

21. Light emitting device according to claim 20, wherein the polymer matrix is
a polystyrene,
a PVC,
a polymethacrylate,
a polynitrile,
a silicone, a polyamide, a polyester, a polysulfone, a polyurethane, a poly-nitride, a poly-alcohol, an ethylcellulose, a poly-vinyl-butyral,
a polyalkene,
a polydiene, a hydrogel, or a combination thereof.

22. Light emitting device according to claim 20, wherein the polymer matrix has a permeability for oxygen lower than $3*10^{-10}$ $cm^2/(s \cdot cm_{Hg})$.

23. Light emitting device according to claim 1, wherein the components are embedded into an oligomer matrix.

24. Light emitting device according to claim 1, wherein the components are dispersed into a solution.

25. Light emitting device according to claim 1, wherein the light in the first emission spectrum is incoherent.

26. Light emitting device according to claim 1, wherein the emission intensity of the LED in ambient air environment is not more than 30% lower than the respective intensity in an oxygen-free atmosphere.

27. Method for manufacturing a light emitting device, comprising the steps of
providing a light emitting diode LED emitting light in a first emission spectrum,
providing a composition comprising at least two components and being adapted to absorb at least a part of the light in the first emission spectrum and upon absorption to emit an up-converted light in a second emission spectrum, wherein the light in said second emission spectrum has a wavelength range lower than the wavelength range of the light in the first emission spectrum, and
choosing the composition such that the light emitted by the light emitting device comprises a mixture at least of light in the first emission spectrum and of light in the second emission spectrum.

28. Light emitting device according to claim 9, wherein the component substantially insensitive to quenching by oxygen molecules is a EU-chelate complex, a Tb-chelate complex, or an inorganic compound.

29. Light emitting device according to claim 28, wherein the component substantially insensitive to quenching by oxygen molecules is an inorganic compound selected from the group consisting of inorganic nanoparticles, inorganic nanocrystals, and inorganic powders.

30. Light emitting device according to claim 11, wherein the host crystal, glass, ceramics, or powder is selected from the group consisting of oxides, silicates, orthosilicates, oxy-orthosilicates, halosilicates, phosphates, halophosphates, borates, aluminates, gallates, molybdates, tungstates, halides, oxyhalides, sulfates, sulfides, oxysulfides, and carbo-nitrides.

31. Light emitting device according to claim 20, wherein the polymer matrix is selected from the group consisting of poly-butyl-styrene, poly-methyl-styrene, PMMA, PEMA, polyacrylonitrile, polypropylene, poly-butadiene, or a combination thereof.

32. Light emitting device according to claim 20, wherein the polymer matrix has a permeability for oxygen lower than $1*10^{-10}$ $cm^2/(s \cdot cm_{Hg})$.

* * * * *